(12) United States Patent
Kuroda

(10) Patent No.: US 7,671,682 B2
(45) Date of Patent: Mar. 2, 2010

(54) VARIABLE GAIN POWER AMPLIFIER

(75) Inventor: Hidehiko Kuroda, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 80 days.

(21) Appl. No.: 11/559,220

(22) Filed: Nov. 13, 2006

(65) Prior Publication Data
US 2007/0120602 A1    May 31, 2007

(30) Foreign Application Priority Data
Nov. 15, 2005    (JP)    ............................. 2005-329719

(51) Int. Cl.
    $H03F\ 3/04$    (2006.01)
(52) U.S. Cl. .................. 330/289; 330/278; 330/296; 330/285; 361/93.1; 375/376
(58) Field of Classification Search ............... 361/93.1; 330/289, 278, 285, 279, 296; 375/376
    See application file for complete search history.

(56) References Cited

U.S. PATENT DOCUMENTS

| | | | | |
|---|---|---|---|---|
| 3,299,356 A | * | 1/1967 | Bornhorst et al. | ........... 455/108 |
| 6,661,290 B2 | * | 12/2003 | Sugiura | .................. 330/289 |
| 7,009,453 B2 | * | 3/2006 | Kuriyama | ................ 330/289 |
| 2001/0028695 A1 | * | 10/2001 | Matsui | ....................... 375/376 |
| 2002/0118500 A1 | * | 8/2002 | Covi et al. | ................ 361/93.1 |
| 2003/0151461 A1 | * | 8/2003 | Arayashiki et al. | .......... 330/278 |

FOREIGN PATENT DOCUMENTS

| | | |
|---|---|---|
| JP | 6-164249 A | 6/1994 |
| JP | 2000-295050 A | 10/2000 |

* cited by examiner

*Primary Examiner*—Michael B Shingleton
(74) *Attorney, Agent, or Firm*—Sughrue Mion, PLLC

(57) ABSTRACT

A variable gain power amplifier includes a power amplifying unit and a signal generating unit. The power amplifying unit includes a control terminal, and a gain of the power amplifying unit is variable by a control signal provided through the control terminal. The signal generating unit generates the control signal to be provided to the control terminal. The signal generating unit includes a switching circuit to be turned on and off by a binary signal, a constant current source that generates a constant current, and a variable current source that generates a variable current. Also, the signal generating unit generates, when the switching circuit is on, a control signal of a magnitude that turns on the power amplifying unit and depends on a magnitude of a sum of the constant current and the variable current. When the switching circuit is off, the signal generating unit generates a control signal of a magnitude that turns off the power amplifying unit.

6 Claims, 6 Drawing Sheets

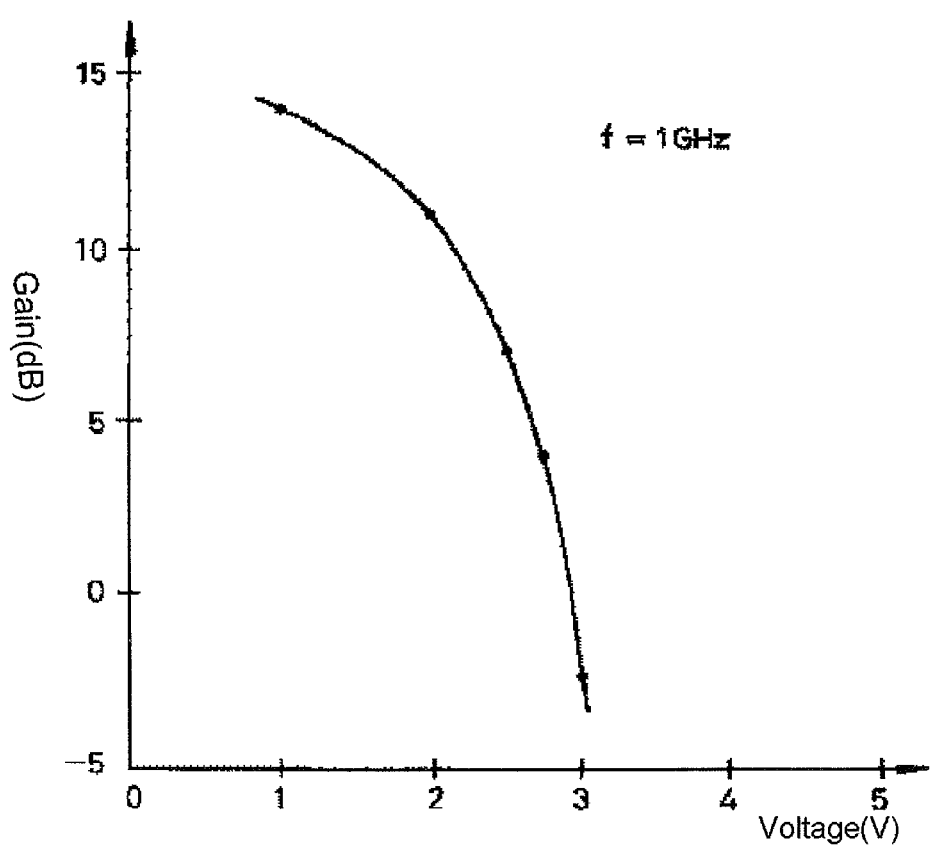
PRIOR ART FIG. 6

VARIABLE GAIN POWER AMPLIFIER

This application is based on Japanese patent application No. 2005-329719, the content of which is incorporated hereinto by reference.

BACKGROUND

1. Technical Field

The present invention relates to a variable gain power amplifier.

2. Related Art

In the field of communication apparatus employed for the Industry Science Medical (hereinafter, ISM) band or specific low-power radio transmission, the increasing demand for a smaller size, lower power consumption and higher accuracy in transmission frequency has been expanding the employment of ICs for performing various functions. Transmitters used in those communication apparatus have similarly come to include in an IC the functional circuits such as an oscillator, a PLL frequency synthesizer, a modulator, a power amplifier, and a control microcomputer.

Regarding the transmitter mainly used for the purpose of remote keyless entry (hereinafter, RKE) in particular, the circuits definitely have to be packaged in an IC, in order to be disposed in an automobile key. To be more detailed, the necessary circuits have to be implemented in a small package with a minimum necessary number of functional pins, thus to be coupled with a limited number of simple external parts. Also, for achieving compatibility with both domestic and overseas standards, it is desirable that a single IC is capable of performing the Amplitude Shift Keying (hereinafter, ASK) or On-Off-Keying (hereinafter, OOK, including enabling action based on an on/off control) and the Frequency Shift Keying (FSK), and that the output power is micro-adjustable.

Conventional power amplifiers include those disclosed in Japanese Laid-open patent publications No. H06-164249 and No. 2000-295050. FIG. 5 is a circuit diagram of a variable gain power amplifier disclosed in the former publication. A transistor 101 constitutes a power amplifying unit self-biased by resistances 102, 103. To the base of the transistor 101, a variable current source 110 is connected. The variable current source 110 is set up as a current mirror circuit including transistors 111, 112. In this amplifier, an input voltage for controlling the current mirror is applied to a terminal 104, to control the gain through a shunt control of the base bias current.

FIG. 6 is a graph showing a gain control characteristic of the variable gain power amplifier of FIG. 5. The horizontal axis represents the input voltage (V) for current mirror control, and the vertical axis represents the gain (dB), respectively. As is understood from the graph, the variable current source 110 is applied to the base of the power amplifying transistor 101, so that the gain control is performed through controlling the base current depending on the control voltage.

SUMMARY OF THE INVENTION

In the amplifier shown in FIG. 5, however, a slight fluctuation in control voltage leads to a large fluctuation in gain, which impedes attaining a desired gain with high accuracy.

According to the present invention, there is provided a variable gain power amplifier, comprising: a power amplifying unit including a control terminal through which a control signal that varies a gain of the power amplifying unit is provided; and a signal generating unit that generates the control signal to be provided to the control terminal, wherein the signal generating unit includes a switching circuit to be turned on and off by a binary signal, a constant current source that generates a constant current, and a variable current source that generates a variable current; the signal generating unit generates, when the switching circuit is on, the control signal of a magnitude that turns on the power amplifying unit and depends on a magnitude of a sum of the constant current and the variable current; and the signal generating unit generates, when the switching circuit is off, the control signal of a magnitude that turns off the power amplifying unit.

According to the present invention, there is also provided a variable gain power amplifier, comprising: a power amplifying unit including a control terminal through which a control signal that varies a gain of the power amplifying unit is provided; and a signal generating unit that generates the control signal to be provided to the control terminal, wherein the signal generating unit includes a constant current source that generates a constant current and a variable current source that generates a variable current; and the signal generating unit generates the control signal of a magnitude that depends on a magnitude of a sum of the constant current and the variable current.

In the amplifiers thus configured, the control signal of a magnitude that depends on a magnitude of a sum of the constant current from the constant current source and the variable current from the variable current source is provided to the control terminal of the power amplifying unit. Such arrangement allows analog control of the power gain.

Thus, the present invention provides a variable gain power amplifier capable of controlling a gain with high accuracy.

BRIEF DESCRIPTION OF THE DRAWINGS

The above and other objects, advantages and features of the present invention will be more apparent from the following description taken in conjunction with the accompanying drawings, in which:

FIG. 6 is a graph showing a gain control characteristic of the variable gain power amplifier of FIG. 5.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, an exemplary embodiment of a variable gain power amplifier according to the present invention will be described in details, referring to the accompanying drawings.

In all the drawings, same constituents are given the same numerals, and the description thereof will not be repeated.

First Embodiment

Figure 1:
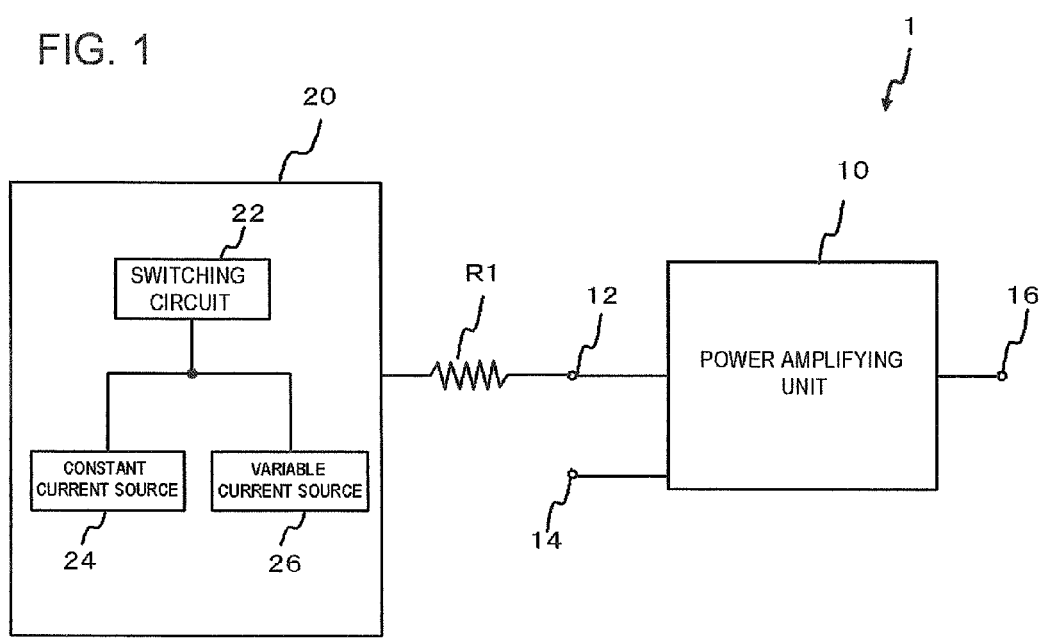
FIG. 1 is a block diagram of a variable gain power amplifier according to the first embodiment of the present invention.

FIG. 1 is a block diagram of a variable gain power amplifier according to the first embodiment of the present invention. The variable gain power amplifier 1 includes a power amplifying unit 10 and a signal generating unit 20. The power amplifying unit 10 includes a control terminal 12, through which a control signal that varies a gain of the power amplifying unit 10 is provided. A terminal 14 and a terminal 16 respectively serve as an input terminal and an output terminal of the power amplifying unit 10.

To the control terminal 12 of the power amplifying unit 10, a signal generating unit 20 is connected via a resistance element R1 (first resistance element). The signal generating unit 20 generates the control signal to be provided to the control terminal 12. The signal generating unit 20 includes a switching circuit 22 to be turned on and off by a binary signal, a constant current source 24 that generates a constant current, and a variable current source 26 that generates a variable current. Also, the signal generating unit 20 generates, when the switching circuit 22 is on, a control signal of a magnitude that turns on the power amplifying unit 10 and depends on a magnitude of a sum of the constant current and the variable current. In contrast when the switching circuit 22 is off, the signal generating unit 20 generates a control signal of a magnitude that turns off the power amplifying unit 10.

Figure 2:
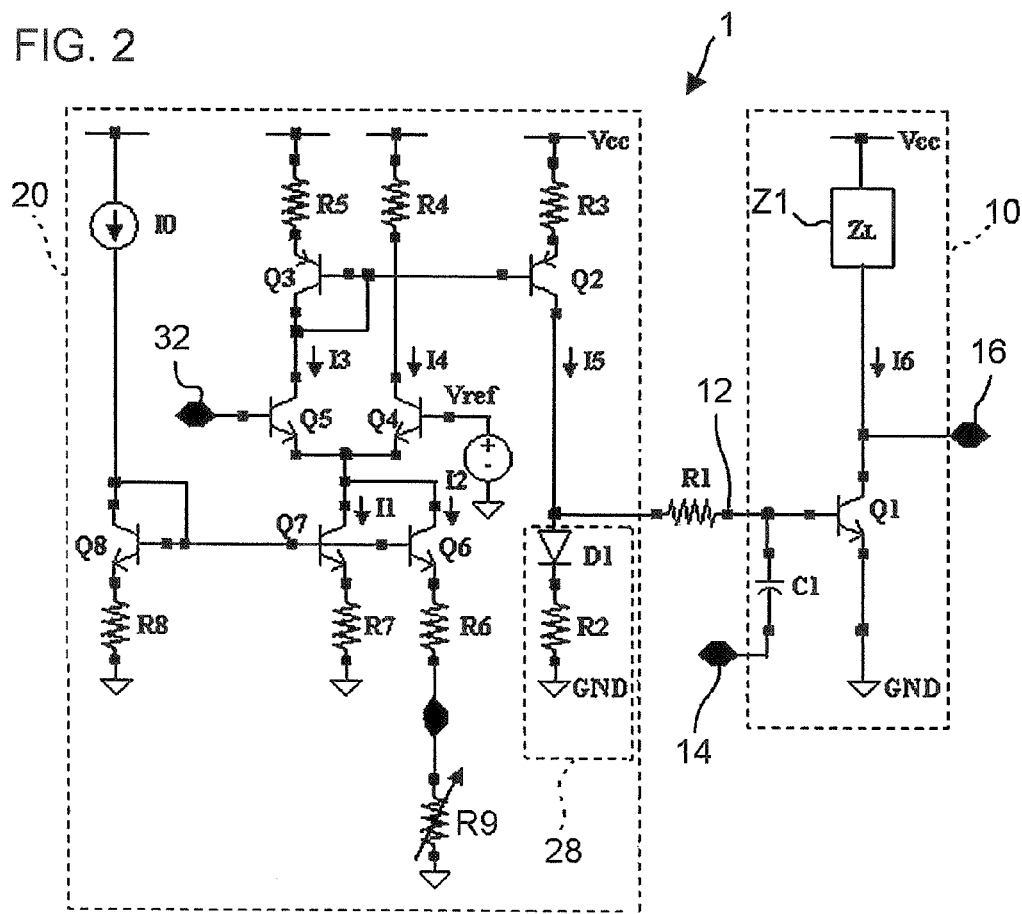
FIG. 2 is a circuit diagram showing a circuit configuration of the variable gain power amplifier shown in FIG. 1.

FIG. 2 is a circuit diagram showing a circuit configuration of the variable gain power amplifier shown in FIG. 1. In this circuit, the power amplifying unit 10 includes a bipolar transistor Q1. The base terminal of the bipolar transistor Q1 corresponds to the control terminal 12. The emitter terminal of the bipolar transistor Q1 is connected to the ground (GND), and the collector terminal is connected to the terminal 16. Between the collector terminal and a power source (Vcc), a load Z1 is connected. The base terminal of the bipolar transistor Q1 is connected to the terminal 14 via a coupling capacitor C1.

The switching circuit 22 includes two bipolar transistors Q4, Q5 constituting a differential pair with each other. The bipolar transistors Q4, Q5 are of an NPN type. To the base terminal of the bipolar transistor Q4, a reference voltage Vref is applied. The reference voltage Vref is given a value between a source potential Vcc and the ground potential 0. The base terminal of the bipolar transistor Q5 is connected to a terminal 32, to which a control voltage for an ASK action and an enabling action is applied.

The constant current source 24 includes a bipolar transistor Q7 and a resistance element R7. The variable current source 26 includes a bipolar transistor Q6 and resistance elements R6, R9. The resistance element R9 is a variable resistance element, and is connected in series to the resistance element R6. The variable current source 26 generates a current of a magnitude that depends on the resistance value of the resistance element R9, as the variable current. In the variable gain power amplifier 1, for example, the resistance element R9 may be provided as an external resistance, and all the remaining elements except the resistance element R9 may be mounted on a single IC.

The signal generating unit 20 further includes a bias circuit 28 connected to an end (first end) of the resistance element R1, the other end (second end) of which is connected to the control terminal 12 of the power amplifying unit 10. The bias circuit 28 includes a diode D1 connected to the ground via a resistance element R2 (second resistance element). The signal generating unit 20 also includes a current mirror circuit having bipolar transistors Q2, Q3. The switching circuit 22 (more specifically, the collector terminal of the bipolar transistor Q5) is connected to the first end of the resistance element R1, via the current mirror circuit.

The circuit shown in FIG. 2 operates as follows. When a High-level control signal (>Vref) is applied to the control terminal 32, a current I3 running through the bipolar transistor Q5 is folded by the current mirror circuit. Then a current I5 flows, thereby generating a certain bias in the bias circuit 28. Accordingly, a current flows to the bipolar transistor Q1, so that a current I6 and the load Z1 determine a power output by the power amplifying unit 10. At this stage, I3 is equal to I1+I2; I4 is nearly equal to 0; and I6 is proportional to I3, and hence Pout is a function of I6. Thus, the output power varies with the variation of the current I2 from the variable current source 26.

Here, the value of the variable current I2 may be set by adjusting the resistance value of the resistance element R9, as stated above. For example, when the resistance value of the resistance element R9 is infinite (i.e. open), I2 is equal to 0 and I3 is equal to I1, and hence the base bias and the collector current of the bipolar transistor Q1 both becomes a minimum. Accordingly, the output power of the power amplifying unit 10 also becomes a minimum. On the other hand, when the resistance value of the resistance element R9 is 0 (i.e. short-circuited), I3 is equal to I1+I2, and hence the base bias and the collector current of the bipolar transistor Q1 both becomes a maximum. Accordingly, the output power of the power amplifying unit 10 also becomes a maximum.

When a Low-level control signal (<Vref) is applied to the terminal 32, I3 is nearly equal to 0 and I4 is equal to I1+I2, and therefore I6 is nearly equal to 0. Accordingly, the bipolar transistor Q1 is turned off irrespective of the resistance value of the resistance element R9, and the power amplification is not executed.

Figure 3:
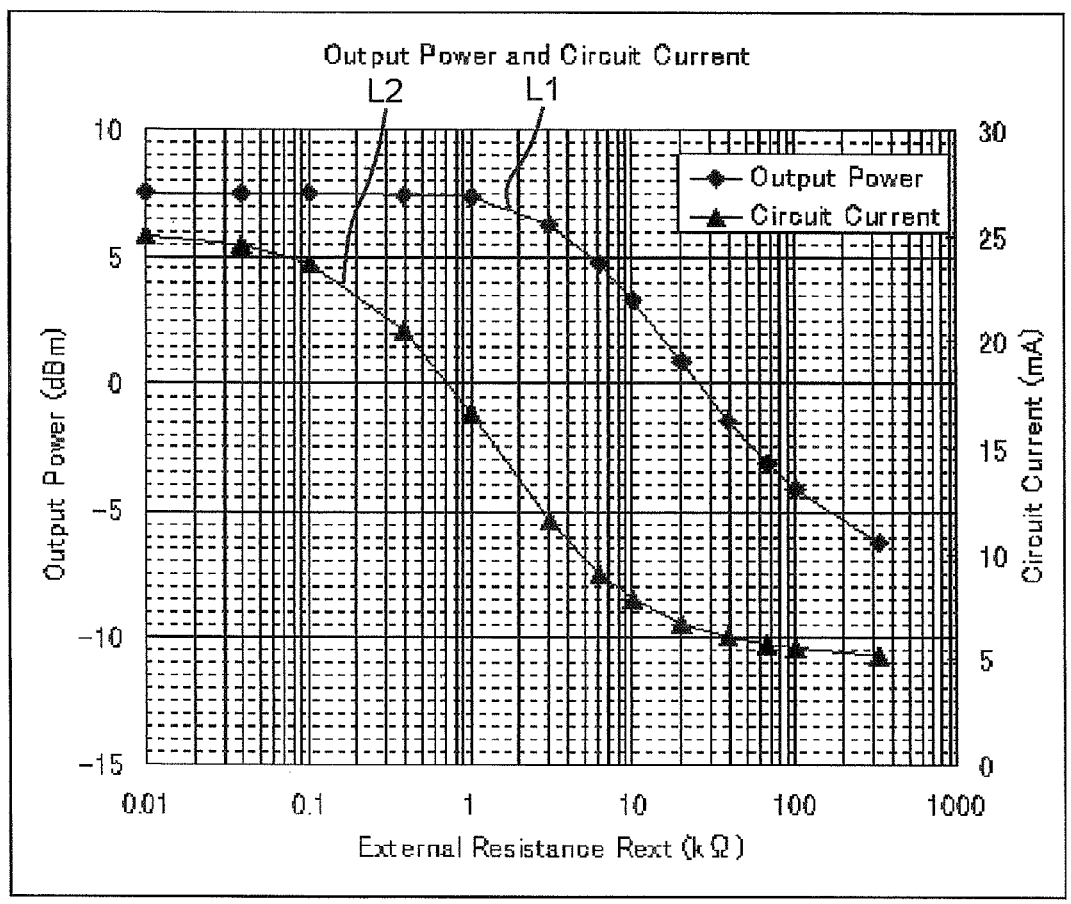
FIG. 3 is a graph showing a performance characteristic of the circuit shown in FIG. 2.

FIG. 3 is a graph showing a performance characteristic of the circuit shown in FIG. 2. The horizontal axis represents the resistance value (kΩ) of the resistance element R9, and the vertical axis represents the output power (dBm) and the circuit current (mA). A line L1 and a line L2 respectively corresponds to the output power and the circuit current. In view of the graph, it is understood that when the resistance value of the resistance element R9 is varied from 1 kΩ to 100 kΩ, an output variation not less than 10 dB can be attained. This allows applying a larger input dynamic range and adjusting the output power with high accuracy by micro-adjusting the resistance value of the resistance element R9. Further, it is understood that the circuit current increases and decreases in proportion to the variation in output. This is advantageous in reducing the power consumption by the circuit.

The foregoing embodiment provides the following advantageous effects. In the variable gain power amplifier 1, the control signal of the magnitude depending on the magnitude of the sum of the constant current from the constant current source 24 and the variable current from the variable current source 26 is provided to the control terminal 12 of the power amplifying unit 10. This allows analog control of the power gain. Thus, the variable gain power amplifier 1 allows controlling the gain with high accuracy.

Also, the signal generating unit 20 includes the switching circuit 22, and the on and off states of the switching circuit 22 turn the power amplifying unit 10 on and off. When the switching circuit 22 is on, the control signal of a magnitude depending on the magnitude of the sum of the constant current from the constant current source 24 and the variable current from the variable current source 26 is provided to the control terminal 12 of the power amplifying unit 10. This allows both the analog control of the power gain, and digital switching of the on/off state of the power amplifying unit 10. Thus, the variable gain power amplifier 1 allows executing the on/off control of the output, as well as controlling the gain with high accuracy. Here, providing the switching circuit 22 in the signal generating unit 20 is not mandatory.

Figure 5:
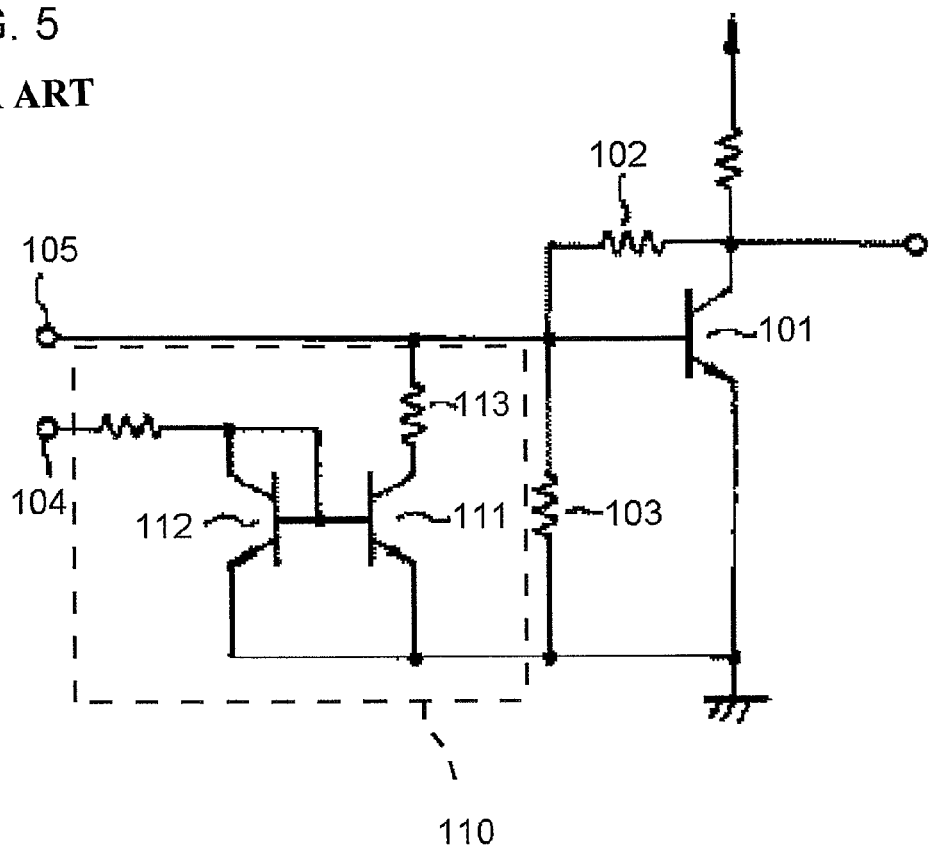
FIG. 5 is a circuit diagram of a conventional variable gain power amplifier.

Meanwhile, in the foregoing amplifier shown in FIG. 5, since the current mirror circuit employed for the base bias control is inserted between base and emitter of the transistor 101, the collector-emitter voltage of the transistor 111 is approx. 0.7 V even under a normal operation. Accordingly, when the control voltage is increased so as to increase the current mirror current, and thereby the voltage drop by the resistance 113 is increased, the collector-emitter voltage of the transistor 111 is further minimized to be closer to the saturation region, thereby inhibiting executing an accurate control.

Also, when a bias voltage according to Class-C amplification is applied to the transistor 101, the base-emitter voltage becomes close to 0 V when no signal is input, and the collector-emitter voltage of the transistor 111 also becomes close to 0 V, thereby reaching the saturation. In this respect, the Class-C specification that creates larger distortion yet provides higher efficiency is by far more preferred to Class-A specification that creates smaller distortion but offers lower power efficiency for operating power amplifiers, from the viewpoint of energy saving. Further, in the circuit shown in FIG. 5, since the gain is controlled based on the voltage, a slight fluctuation in voltage leads to a large fluctuation in output. In other words, the input dynamic range is limited.

In contrast, the variable gain power amplifier 1 allows adjusting the output power with high accuracy as desired, simply by controlling the resistance (resistance element R9), and besides allows executing the on/off control such as the ASK or OOK, under the same status. Further, the variable gain power amplifier 1 controls the current I5 supplied to the bias circuit 28, so as to generate a bias voltage through the diode D1 and the resistance element R2. Accordingly, since the base potential of the bipolar transistor Q1 is low when no signal is input and hence no transistor is saturated even in an off state, the variable gain power amplifier 1 can be operated with the bias voltage according to Class-C specification. Such configuration allows applying a large input dynamic range, and thereby micro-adjusting the gain. This is because, even though the resistance (resistance element R9) for the gain control is largely varied, the current running through the bias circuit 28 is restrained owing to a negative feedback against a variation in shunted current, and thereby a sharp fluctuation in gain can be prevented.

Also, in the variable gain power amplifier 1, since a single circuit serves for both setting the bias current and performing the on/off action, the gain control can be easily executed with high accuracy, and at a high speed. Further, since the simple circuit arrangement of the variable gain power amplifier 1 allows reducing the footprint of the chip, the variable gain power amplifier 1 is appropriate for being mounted on an IC. Accordingly, the variable gain power amplifier 1 can be suitably applied to transmitters for the RKE or the like which are required to be small in size. In addition, the variable gain power amplifier 1 is suitable for a low-voltage operation because the variable gain power amplifier 1 can operate with the Vcc of 2.1V or higher when the driving voltage Vce is 0.7V.

Further, since the variable gain power amplifier 1 digitally executes the on/off control, the variable gain power amplifier 1 is resistant against a noise intruding through the terminal 32. This eliminates the need to provide the control voltage source, unlike the amplifier shown in FIG. 5. Still further, since the variable gain power amplifier 1 includes the switching circuit 22 in the same circuit, the on/off control can be easily executed at a high speed, under a state that the output power is adjusted at a certain value.

The variable gain power amplifier 1 is suitably applicable, because of the foregoing advantages, to transmitters for the ISM band or specific low-power radio transmission, such as short-distance data communication, the RKE, home security and so forth.

Second Embodiment

Figure 4:
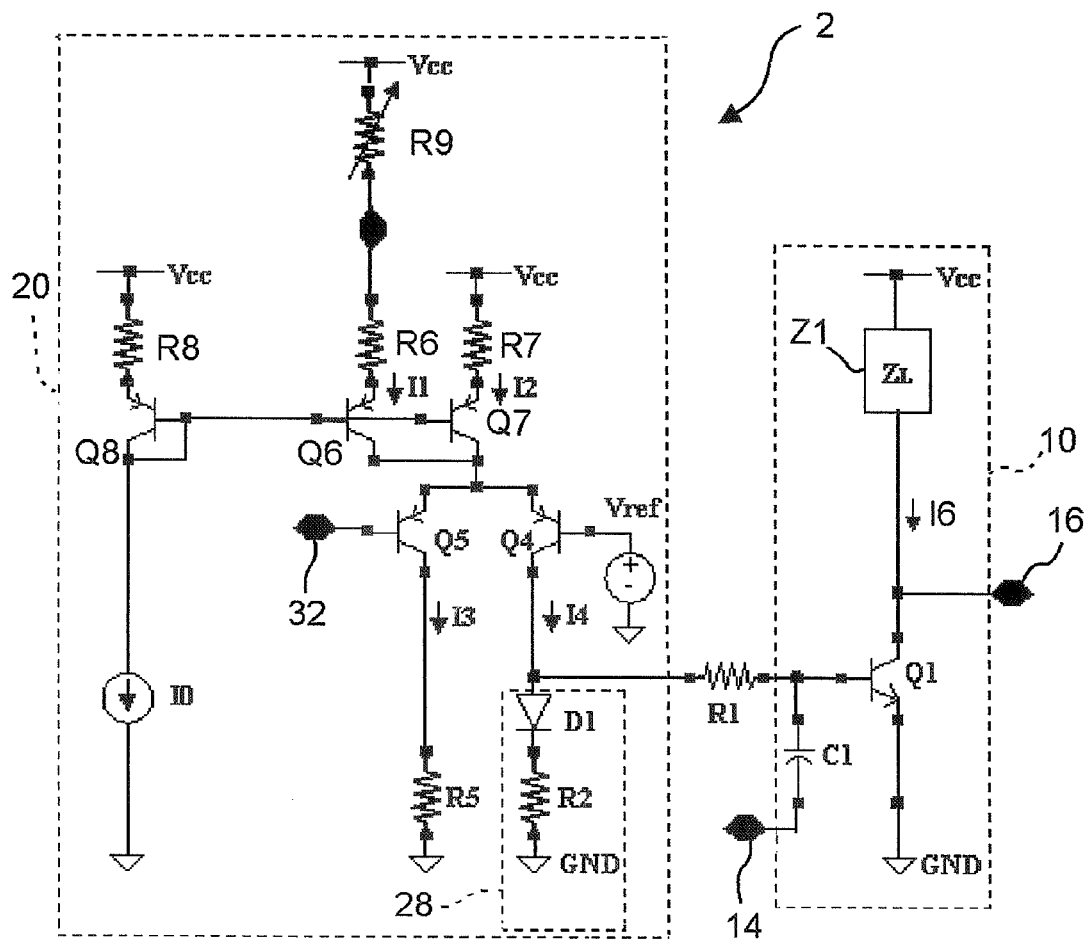
FIG. 4 is a circuit diagram of a variable gain power amplifier according to the second embodiment of the present invention.

FIG. 4 is a circuit diagram of a variable gain power amplifier according to the second embodiment of the present invention. The variable gain power amplifier 2 includes the power amplifying unit 10 and the signal generating unit 20. The configuration of the power amplifying unit 10 is as already described referring to FIG. 2. In the signal generating unit 20 according to this embodiment, the bipolar transistors Q4, Q5 constituting the switching circuit are PNP-type bipolar transistors. Also, while the constant current source and the variable current source are located on the ground side of the switching circuit in the signal generating unit 20 shown in FIG. 2, the constant current source and the variable current source are located on the power source side of the switching circuit in this embodiment. The variable gain power amplifier 2 operates similarly to the variable gain power amplifier 1 shown in FIG. 2.

The variable gain power amplifier 2 thus configured offers the following advantageous effects, in addition to those offered by the foregoing variable gain power amplifier 1. Employing the differential pair of PNP transistors for constituting the switching circuit allows further reducing the number of constituent elements, thus making the variable gain power amplifier 2 more appropriate for use in an IC. Further, the folding action of the current mirror can be reduced by one stage, which leads to reduction in error due to an increase in base current originating from degradation or fluctuation of hFE of the transistors, thereby facilitating controlling the gain with increased accuracy.

The variable gain power amplifier according to the present invention is not limited to the foregoing embodiments, but various modifications may be made. For example, the bipolar transistor employed in the embodiments may be substituted with a field-effect transistor (FET). In this case the same operation can be performed as that with the bipolar transistor, with the additional advantage of further reduction in chip footprint, and hence higher integration level of the IC.

It is apparent that the present invention is not limited to the above embodiment, and may be modified and changed without departing from the scope and spirit of the invention.

What is claimed is:

1. A variable gain power amplifier, comprising:
a power amplifying unit including a control terminal through which a control signal that varies a gain of said power amplifying unit is provided; and
a signal generating unit that generates said control signal to be provided to said control terminal,
wherein said signal generating unit comprises: a current mirror circuit, a constant current source that generates a constant current, and a variable current source that generates a variable current;
said variable current source comprises a variable resistance element;

said signal generating unit generates said control signal of a magnitude that turns on said power amplifying unit;

said control signal is a mirror current generated by said current mirror circuit based on a reference current of said current mirror circuit; and said reference current of said mirror circuit is the sum of a positive current generated by said constant current source and a positive current generated by said variable current source; and a magnitude of said positive current generated by said variable current source is controlled by said variable resistance element.

2. The variable gain power amplifier according to claim 1, further comprising a switching circuit to be turned on and off by a binary signal, wherein said switching circuit includes two transistors that constitute a differential pair with each other.

3. The variable gain power amplifier according to claim 1, wherein said signal generating unit includes a bias circuit connected to a first end of a first resistance element, a second end of which is connected to said control terminal of said power amplifying unit; and said bias circuit includes a diode connected to a ground via a second resistance element.

4. The variable gain power amplifier according to claim 3, further comprising a switching circuit to be turned on and off by a binary signal, said switching circuit is connected to said first end of said first resistance element via said current mirror circuit.

5. The variable gain power amplifier according to claim 1, wherein said power amplifying unit includes a bipolar transistor; and a base terminal of said bipolar transistor corresponds to said control terminal.

6. The variable gain power amplifier according to claim 2, wherein said transistors are PNP-type transistors.

* * * * *